US008221825B2

(12) United States Patent
Reitz et al.

(10) Patent No.: US 8,221,825 B2
(45) Date of Patent: Jul. 17, 2012

(54) COMPREHENSIVE METHOD FOR LOCAL APPLICATION AND LOCAL REPAIR OF THERMAL BARRIER COATINGS

(75) Inventors: Daniel Reitz, Suhr (CH); Sophie Duval, Zurich (CH); Piero-Daniele Grasso, Oberweningen (CH); Alexander Stankowski, Siggenthal-Station (CH); Fernando Manuel Santos Silverio, Wettingen (CH)

(73) Assignee: ALSTOM Technology Ltd., Baden (CH)

( * ) Notice: Subject to any disclaimer, the term of this patent is extended or adjusted under 35 U.S.C. 154(b) by 529 days.

(21) Appl. No.: 12/427,186

(22) Filed: Apr. 21, 2009

(65) Prior Publication Data

US 2010/0247740 A1 Sep. 30, 2010

(30) Foreign Application Priority Data

Mar. 30, 2009 (EP) .................................... 09156600

(51) Int. Cl.

| | |
|---|---|
| ***C03B 29/00*** | (2006.01) |
| ***C04B 33/34*** | (2006.01) |
| ***C23C 16/52*** | (2006.01) |
| ***B05D 3/00*** | (2006.01) |
| ***B32B 43/00*** | (2006.01) |
| ***B05C 13/00*** | (2006.01) |
| ***B41N 1/24*** | (2006.01) |

(52) U.S. Cl. ......... 427/8; 427/140; 427/142; 156/89.11; 156/89.22; 156/155; 156/275.7

(58) Field of Classification Search .............. 427/8, 140, 427/142; 156/89.11, 89.22, 89.25, 89.26, 156/155, 275.5
See application file for complete search history.

(56) References Cited

U.S. PATENT DOCUMENTS 4,639,388 A * 1/1987 Ainsworth et al. ........... 428/117
(Continued)

FOREIGN PATENT DOCUMENTS

EP 0713957 5/1996
(Continued)

OTHER PUBLICATIONS

Search Report for European Patent App. No. 09156600.0 (Jul. 10, 2009).

(Continued)

*Primary Examiner* — Michael Cleveland
*Assistant Examiner* — Michael Wieczorek
(74) *Attorney, Agent, or Firm* — Cermak Nakajima LLP; Adam J. Cermak

(57) ABSTRACT

A method for the local initial application of a thermal barrier coating layer (3), or for the local repair of coating defects and/or deteriorations of components (1) in the hot gas path of a gas turbine engine, which components are coated with a thermal barrier coating layer, includes at least the following steps:

(I) in the case of repair, normally overall inspection of the whole component (1) for the determination of the location of defect/deterioration, as well as of corresponding type of defect/deterioration of each place for a multitude of locations of the component (1);

(II) if needed, preparation of the surface in at least one location;

(III) local application of a ceramic tissue together with a wet chemical thermal barrier coating layer deposition material for the formation of a patch (5) of ceramic matrix composite;

(IV)a intermediate inspection of the patch and/or the surface;

(IV)b in the case of a repetitive and/or multi-step repair method, subsequent layer application of a ceramic tissue together with a wet chemical thermal barrier coating layer deposition material for the formation of a patch (5) of ceramic matrix composite at this location;

(V) if needed, surface finishing at the at least one location; and (VI) final inspection of the at least one location.

Steps (IV)a, (V) and (VI) can be omitted with the provision that at least one of steps (IV)a or (VI) is carried out.

27 Claims, 4 Drawing Sheets

U.S. PATENT DOCUMENTS

| | | | | |
|---|---|---|---|---|
| 7,198,860 | B2 * | 4/2007 | Vance | 428/701 |
| 7,282,274 | B2 * | 10/2007 | Millard et al. | 428/545 |
| 2003/0167616 | A1 | 9/2003 | Harding et al. | |
| 2003/0196305 | A1 | 10/2003 | Kebbede et al. | |
| 2007/0063351 | A1 * | 3/2007 | Duda et al. | 257/758 |
| 2008/0229567 | A1 | 9/2008 | Bublath et al. | |

FOREIGN PATENT DOCUMENTS

| | | |
|---|---|---|
| EP | 0808913 | 11/1997 |
| EP | 1304446 | 4/2003 |
| EP | 1507236 | 2/2005 |
| EP | 1529765 | 5/2005 |
| EP | 1559499 | 8/2005 |
| EP | 1591549 | 11/2005 |
| EP | 1707301 | 10/2006 |
| EP | 1739204 | 1/2007 |
| EP | 1806423 | 7/2007 |
| WO | 2005070613 | 8/2005 |

OTHER PUBLICATIONS

Search Report for European Patent App. No. 10156168.6 (Apr. 27, 2010).

* cited by examiner

COMPREHENSIVE METHOD FOR LOCAL APPLICATION AND LOCAL REPAIR OF THERMAL BARRIER COATINGS

This application claims priority under 35 U.S.C. §119 to European application no. 09156600.0, filed 30 Mar. 2009, the entirety of which is incorporated by reference herein.

BACKGROUND

1. Field of Endeavor

The present invention relates to the field of methods for the manufacturing and the service of components in the hot gas path of, for example, gas turbines. Specifically, it relates to a method of improved localized build-up of thermal barrier coatings (TBC) on hot gas path parts in gas turbines and other heat engines combined with a comprehensive approach of inspection to better assure the durability of the coating.

2. Brief Description of the Related Art

Coating systems for hot gas path (HGP) parts of gas turbine engines for the protection of components are well known. Many of these coating systems consist of a metallic bond coat (BC) layer and a ceramic thermal barrier coating (TBC) top layer. The TBC layer is predominantly applied to protect the base material of the components against high temperature environments, whereas the metallic BC ensures a good bonding of the TBC layer, but also protects the base material against oxidation and corrosion. During operation the BC/TBC system has to sustain thermal cycling and harsh environmental conditions. Also to be considered are damages due to transport and installation as well as insufficient quality of the coating as produced in the workshop. As a result, localized loss of the TBC layer can occur, e.g., due to foreign object impacts, phase changes, and fatigue, but also sintering of the ceramic and erosive wear, particularly on highly loaded locations of components. Additionally, in certain cases localized uncoated areas on new manufactured components have to be subsequently TBC coated in a flexible and easy manner. Consequently, there is a need to perform local application as well as local repair of TBC layers to allow further operation.

Local application (local initial application as well as local repair of local damages) of TBC with a thermal spray technique, as, for example, disclosed in U.S. Patent Application Publication No. 2007/0063351 A1 or U.S. Pat. No. 5,972,424, similar to the technique used to apply TBC on new manufactured parts (see, e.g., U.S. Pat. Nos. 4,248,940 and 3,006,782) has some advantages. A satisfying adhesion of the repaired coating, a controlled microstructure and phase are for example known to be provided by such a local application process. However, thermal spray techniques are more suitable, e.g., for a local application off-site in dedicated sites for manufacturing and repair than for on-site use. Health and safety issues, cost and technology status of portable devices are boundary conditions, which prevent the use of spray techniques for local application such as repair on-site. Further disadvantages are the accessibility of the components when mounted in the engine and contamination of the hot engine parts in the vicinity of the local application spot due to the local application process.

In comparison, wet application seems more suited and has many advantages in terms of, e.g., costs and easy processing. Such local application of TBC with wet processing, like, for example, using slurry or sol-gel methods, have been investigated many times in the past already. One challenge is to coat a layer with an adapted and sufficient thickness, which is at least equivalent to the one of the original TBC. Sol-gel techniques, as for example described in U.S. Pat. No. 6,235,352, ensure a good bonding of the newly constituted layer but lead generally to an insufficient layer thickness. Another relevant concern by using wet chemical processing is that during drying and curing the applied layer has a pronounced tendency to shrink leading to cracks, bonding defects and spallation.

Attempts to increase the layer thickness, reduce shrinking, and prevent cracking have been pursued in the state-of-the-art, e.g., by adding oxide particle fillers in the sol-gel solution or to the slurry as, for example, disclosed in U.S. Pat. No. 5,585,136 and U.S. Patent Application Publication No. 2007/0224359 A1. Similarly, hollow spheres were suggested to serve as filler material, for example in U.S. Pat. No. 5,759,932.

Another issue with the wet chemical processing is to achieve a suitable viscosity in order to coat parts with a complex geometry or in order to coat parts mounted inside the engine (in particular if the surface to be treated is in a vertical position or is facing downwards). In this context, EP 1 739 204 proposes a composition for the slurry having an optimal thixotropic behavior. Another approach is disclosed in EP 1 806 423, in which UV curable polymers are used in order to provide a rigid polymer matrix.

U.S. Pat. No. 5,972,424, proposes a method to repair a gas turbine engine component coated with a thermal barrier coating that includes a metallic bond coat and a ceramic top coat by removing the complete ceramic top coat and parts of the metallic bond coat from an engine-run gas turbine engine component and by inspecting the component. After an inspection step, a metallic flash coat is applied to at least a portion of the component. A ceramic top coat is then applied over predetermined portions of the component, including the portion to which the metallic flash coat was applied.

U.S. Patent Application Publication No. 2007/202269A1 proposes local repair of a thermal barrier coating system on a turbine component that has suffered localized spallation wherein the proposed process includes locally cleaning a spalled region with water to remove the remaining coating from the spalled region and to form a tapered profile in the existing thermal barrier coating; and locally thermally spraying a powder mixture into the cleaned localized spalled region to form a repaired thermal barrier coating. The repaired thermal barrier coating system is integrated with the tapered profile to form a seam free of gaps.

The main problems associated with the repair or local application processes according to the state-of-the-art are as follows. In some cases the complete TBC coating is removed from the component and re-applied (see, e.g., the aforementioned U.S. Pat. No. 5,972,424) rather than keeping the defect-free part of the coating and removing only degraded areas. This is a costly and time consuming process.

Furthermore, a comprehensive inspection for different defect types is not considered in the prior art. Particularly, it is missing that inspection has to be performed prior to repair with appropriate tools in order to locate all degraded areas of the BC/TBC system and in order to only locally repair where it is necessary and appropriate. For example, it is not sufficient just to clean regions with spalled-off TBC, as described for instance in U.S. Patent Application Publication No. 2007/0202269 A1. Different defects will be overlooked in such an approach.

In view of the above, the disadvantages/limits in the state-of-the-art as concerns repair can be summarized as follows. Comprehensive inspection is not considered for the whole component, and for all types of degradation such as TBC erosion, cracking, spallation, delamination, sintering, consumption, oxidation, and corrosion of bond coating (BC) and base metal (BM). Inspection during a repair procedure (intermediate inspection in case the coating consists of several layers) is not considered, and in most of the cases the BC/TBC coating system is completely stripped after service and recoated rather than to inspect it and derive a lifetime statement of the remaining coating and to repair only degraded TBC regions. A final inspection step after the coating application is not considered. Further the reachable layer thickness by pure wet application methods is in general limited and usually a high shrinkage of the applied coating leads to macrocracking as well as weak bonding of the coating to the substrate due to the shrinkage, and the strain tolerance of the suggested coating systems is in general not sufficient. Usually, the thermal barrier effect of the applied coating is not sufficient, complex shapes (convex/concave) are difficult if not impossible to repair with approaches mentioned in prior art, and the same is valid for coating application in a vertical position of the component. The stability of the wet applied coatings against high temperature and repeated temperature changes (thermal cycling) in general not sufficient.

SUMMARY

One of numerous aspects of the present invention includes an improved method for the application of thermal barrier coatings based on wet processes to components in the hot gas path of, for example, a gas turbine, including, on the one hand, a method for the local initial application of a thermal barrier coating and, on the other hand, an improved method for the local repair of thermal barrier coating layers.

Another aspect includes the application of a thermal barrier coating deposited on a component, which includes the combination of a wet process (e.g., slurry process) and a ceramic tissue. The result is a patch or patch layer which is applied to a surface.

Specifically, an exemplary method for the local initial application of a thermal barrier coating layer, or for the local repair of coating defects and/or deteriorations of components in the hot gas path of a gas turbine engine whose components are at least locally coated or to be coated with a thermal barrier coating layer is proposed, includes at least the following steps:

(II) if needed, preparation of the surface in at least one location, where the patch is to be applied and optionally also the surrounding area;

(III) local application of a ceramic tissue together with a wet chemical thermal barrier coating layer deposition material for the formation of a patch of ceramic matrix composite;

(IV)a intermediate inspection of the patch and/or the surface in the at least one location;

(IV)b in case of repetitive and/or multi-step application, further local application of at least one ceramic tissue together with a wet chemical thermal barrier coating layer deposition material for the formation of a further patch of ceramic matrix composite at this location;

(V) if needed, surface finishing at the at least one location; and (VI) final inspection of the at least one location.

Concerning step (II), it should be noted that this step can also be omitted if the surface is already in a condition which allows direct application of the patch. Typically in this step the surface is prepared by a surface manipulation, which allows the patch applied in step (III) to firmly attach to the location. Correspondingly the surface is, for example, treated by grinding, milling, sanding or the like.

Concerning step (III), this is the actual step of application of the patch. Generally speaking, one patch or patch layer of ceramic matrix composite (CMC) is formed of ceramic slurry and (at least one layer of) ceramic tissue;

the ceramic tissue may be infiltrated, partly infiltrated, or not infiltrated with ceramic slurry; and the patch is preferably finished with a layer of ceramic slurry on top, which in the case of application of only one patch, can be carried out in step (V). In the case when more than one patch is applied, the last patch can be finished with a layer of ceramic slurry on top.

The minimum number of patches to be applied is one.

In step (IV)a, essentially the quality of step (III) is checked, and in case the quality of step (III) is insufficient, it can be repeated/supplemented. Thus, in step (IV)a, in particular whether the patch of ceramic matrix composite is firmly attached to the substrate, whether the patch of ceramic matrix composite is sufficiently filled with wet chemical thermal barrier coating layer deposition material, whether the latter wet deposition material is homogeneously hardened, etc., is checked.

Step (IV)b is optional as it is only carried out if more than one patch is applied, one on top of each other. If more than one patch is applied one on top of each other, after the application of each patch an inspection step analogous to the above-mentioned step (IV)a can be carried out. Correspondingly, therefore, in case of, for example, application of three stacked patches, the sequence of steps can be:

(III) application of first patch;

(IV)a inspection of the quality of application of the first patch;

(IV)b application of second patch;

(IV)a inspection of the quality of application of the second patch;

(IV)b application of first patch;

(V) optional surface finishing;

(VI) final inspection of the application site.

As concerns step (V) this step is optional and may include the application of a finishing layer of wet chemical thermal barrier coating layer deposition material and/or impregnation/application of protective layer, and/or mechanical treatment. In addition to these treatment steps or as an alternative, step (V) may include a curing and/or heat treatment step.

As concerns step (VI), this may also be omitted in particular if step (V) is omitted, as then the inspection is provided by step (IV)a.

As a wet chemical thermal barrier coating layer deposition material, a sol-gel process material or a ceramic based slurry material can be used.

The ceramic tissue within step (III) can be infiltrated with the wet chemical thermal barrier coating layer deposition material either prior to, during, or after application of the ceramic tissue to the location where the patch is to be applied.

Correspondingly, the general application of the patch can, in accordance with one preferred embodiment, be described as follows:

1. application of ceramic slurry material (wet chemical thermal barrier coating layer deposition material) on an appropriately prepared surface;

2. application of ceramic tissue on top, wherein the ceramic tissue may be infiltrated, partly infiltrated or not infiltrated with ceramic slurry, so infiltration can be done before, during or after application;

3. a) in the case of creating only one patch (or if it is the last patch), application of a finishing layer of ceramic slurry on top, followed by optional patterning of the surface, followed by at least a drying step and optionally curing;

3. b) in the case of creating more than one patch on top of each other, at least perform one drying step, followed by applying ceramic slurry material, followed by optional patterning, followed by applying ceramic tissue layer (and then continue according to 3a)

4. Finally, the whole patch is at least dried and optionally cured. It is also possible to cure the patch during the engine start up.

Within step (III) it is, however, also possible not to initially apply ceramic slurry material on the surface, but to directly apply ceramic tissue which at least on the surface facing the surface of application is at least partly infiltrated with wet chemical thermal barrier coating layer deposition material. Within step (III) it is also possible to apply ceramic tissue without initial application of ceramic slurry material and to then, from the upper side so to speak, fill the ceramic tissue with ceramic slurry material which then penetrates through the ceramic tissue to the substrate for bonding. The latter option is in particular possible if thin layers of ceramic tissue are applied.

In step (III) and optionally in step (IV)b for the application, a combination of a ceramic tissue with a wet chemical thermal barrier coating layer deposition process (normally a ceramic slurry) can thus be used for the formation of a patch of ceramic matrix composite, and specifically in a first step a wet chemical thermal barrier coating layer material can be applied as a paste or a paint or a reactive liquid, and in a subsequent step a ceramic tissue, which may be woven or nonwoven, can be applied, optionally followed by curing/sintering and/or additional application of a ceramic tissue and/or wet chemical thermal barrier coating deposition material and/or heat treatment.

The ceramic tissue can thus be a woven or nonwoven structure, preferably a ceramic cloth or a ceramic felt. By the choice of the tissue, as well as the level of infiltration, the microstructure of the generated patch can be influenced. It should be noted that the expression 'ceramic tissue' as used herein shall include woven or nonwoven structures made from ceramic, glass, or glass-ceramic. Preferably the ceramic tissue is however a ceramic cloth or a ceramic felt.

So specifically, in step (III) and optionally in step (IV)b for the initial application or the repair, a combination of a ceramic tissue with a wet chemical thermal barrier coating layer deposition process is used for the formation of a patch of ceramic matrix composite.

In this context, the expression 'a wet chemical thermal barrier coating layer deposition process' includes slurry based processes as well as sol gel-based processes. So, as a wet chemical thermal barrier coating layer deposition process, a sol-gel process or a ceramic based slurry process can be used for example in accordance with the documents mentioned in the introductory paragraph, so for example according to U.S. Pat. No. 6,235,352, EP 1 739 204, the disclosure of which documents is specifically incorporated by reference as concerns the possibility of wet chemical thermal barrier coating layer deposition processes and materials. As concerns the ceramic tissue systems, which can be used in accordance with the present invention, those as for example disclosed in U.S. Pat. No. 7,153,464 and WO 2005/070613 are possible, again the disclosures of these documents is specifically incorporated by reference as concerns ceramic tissue systems.

As concerns coating inspection in case of repair and not initial application, one notes the following:

Spallation of TBC from the component is the worst result of coating deterioration and can be identified even visually. However, the coating might be already suffering from predamages like delaminations of the TBC from BC, macrocracks within TBC or BC, or sintering of the TBC, which can finally lead to spallation. Other degradation marks of the coating system, which have to be taken into account, are erosion of the TBC, and consumption, oxidation, corrosion of bond coat and base material.

As most of these defects can hardly be located by the naked eye, the use of appropriate inspection technologies is crucial prior to repair to guarantee the durability of the remaining coating and derive an estimation of the remaining lifetime. The purpose is to locate all areas of coating degradation. During the repair it is also important to do regular inspections especially when the process includes repeating phases. Finally, a quality check of the coating after the build-up has to be performed to ensure reliable further operation.

It has been found that in case of repair, the final result of the repair on-site not only depends on the method chosen but also on how the inspection of the components prior, during, and/or after the repair is carried out.

Another aspect of the present invention therefore also includes a comprehensive inspection approach of the BC/TBC coating system by appropriate techniques prior (to locate all areas with coating deterioration in BC and TBC layer), in between (to accompany the different phases of the repair process and detect defects or insufficient repair already at an early stage, if necessary), and after the TBC repair procedure (to ensure the quality of the restored coating and derive a lifetime estimation, inclusive of inspection between repair steps). The inspection methods are preferably non-destructive, like Infrared (IR) thermography, Ultrasonic testing, Eddy current testing, and X-ray fluorescence, but can be also of locally affecting type (only in the case of the inspection within either step (I) or (IV)a) selected from local or overall removal of the thermal barrier coating layer and/or bond coat layer material. In the latter case, i.e., if locally destructive inspection techniques are used, only those methods are appropriate which can be repaired easily, so which are of a nature which normally are automatically repaired either subsequent to the repair process as described herein.

Another issue is the inspection of the repaired locations at the end of the process. As it is possible that the restoration of the TBC is not successful (even if not visible), a final inspection and/or intermediate inspection, in the case of multi-step repair, of the component is necessary. This is not considered in the prior art.

So, preferably a method for the comprehensive inspection and repair of local coating defects and/or deteriorations of components in the hot gas path of a gas turbine engine according to the invention includes at least the following steps:

(I) overall inspection of the coating system, i.e., the TBC layer, the bond coat, and/or the base material of essentially the whole component for the determination of locations of defect/deterioration as well as of the corresponding type of defect/deterioration of each place for a multitude of locations of the component; and normally determination of the parameters of the method of surface preparation and repair for each of the locations determined (lateral size of necessary patch, depth of defect, etc.);

(II) if needed, preparation of the surface in at least one location;

(III) local application of a ceramic tissue together with a wet chemical thermal barrier coating layer deposition material for the formation of a patch of ceramic matrix composite, which in this case means local repair of the coating at this at least one location preferably using local application of a ceramic tissue together with a wet chemical thermal barrier coating layer deposition material for the formation of a patch of ceramic matrix composite;

(IV)a intermediate inspection of the patch in the at least one location;

(IV)b in the case of a repetitive (multi-layer) and/or multi-step repair method, subsequent continued repair of this location, preferably using local application of a ceramic tissue together with a wet chemical thermal barrier coating layer deposition material for the formation of a patch of ceramic matrix composite;

(V) if needed, surface finishing at the at least one location; and (VI) final inspection of the at least one location.

The preferred embodiment can satisfy the need of a comprehensive assessment of coatings with appropriate techniques and a local repair method for coatings on components for gas turbines and heat engines. It provides a local repair method, which overcomes prior art disadvantages, such as too low achievable thickness and too high shrinkage of the repaired zone. It also enables a repair on-site and in a mounted condition of the component.

In these preferred embodiments of the invention, the method can also overcome a lack in the prior art for assessment of the coatings. In particular, an approach for sequenced inspection with appropriate methods can locate deteriorated areas of the coating prior to repair and improve the reliability of the repair.

In one further embodiment of the present invention, the surrounding area of the initial application or of repair is infiltrated and sealed with appropriate material before the application of the patch to reduce negative chemical and physical interaction as much as possible. Specifically in step (II), a surrounding area of the application location can be infiltrated and/or sealed preferably with a chemical barrier material.

In one embodiment of the present invention, the thickness of applied coating can be adjusted to the actual need (e.g., to the thickness of the adjacent coating).

In one further embodiment of the present invention, the application zone is sealed with a protective layer (after application of a patch) in order to ensure enhanced durability against contaminants. So specifically, in step (IV)b and/or in step (V) the application location is sealed with a protective layer.

According to yet another preferred embodiment, in step (I) and/or in step (IV)b and/or step (VI), defects and/or deteriorations in the thermal barrier coating layer and/or an underlying bond coat layer are determined using a non-destructive method selected from the group of infrared thermography, ultrasonic testing, Eddy current testing, and X-ray fluorescence, and/or, normally only in the case of step (I) or step (IV)a, by using a destructive method preferably selected from local or overall removal of thermal barrier coating layer and/or bond coat layer material. In the latter case, i.e., if locally destructive inspection techniques are used, only those methods are appropriate which can be repaired easily, so which are of a nature which normally are automatically repaired either subsequent the repair process according to the invention.

In steps (III) and (IV)b the patch layer can be built up by using one single patch or by using several patches at least partly on top of each other and/or adjacent to each other. If more than one patch is used, the at least one or more sequentially produced patch layers can have the same or different lateral extension, can have the same or different thicknesses, and can be of the same or of different deposition and material type.

The patch layer can be built up on a bond coat layer and/or on a thermal barrier coating layer. It may also be built up on the base material directly. Indeed, if not only the thermal barrier coating layer is locally defective but also the bond coat layer, and both layers have been removed, it is preferred to only apply thermal barrier coating layer material by using the combination of a ceramic tissue with wet chemical barrier material application and the bond coat is not reconstituted. Since the patch is usually small in particular in the case of repair application, the provision of a bond coat is not necessary. In general in these cases a patch covers only a minor area of the total TBC coated surface area depending on the loading of the part. Specifically, it normally covers at a maximum 30% of the TBC surface area, preferably less than 10%, for critical applications even less than 5%. For initial application it can be up to 100% of the surface area. The patch layer may have a variable thickness as a function of the location and/or any kind of lateral shape depending on the lateral shape of the spot to be initially coated or of the defects to be repaired.

According to a further preferred embodiment, in step (II) the corresponding location is prepared by removing thermal barrier coating layer material and/or bond coating layer material, preferably by using grinding and/or etching and/or polishing and/or (sand) blasting operations, and/or the corresponding location is prepared by surface preparation and/or the surrounding location is masked.

According to yet another preferred embodiment after step (II) and before step (III) a further intermediate inspection step is carried out, in which the mechanical integrity of the remaining coating adjacent to and below the zone to be repaired or of the surrounding coating or surrounding material in general into which an initial application takes place, is checked and/or the presence of corrosion and/or oxidation products on the locations to be repaired (or where the coating is to be initially applied) is determined, and optionally including checking of optimum surface preparation for the coating inclusive of roughness and/or cleanliness assessment.

According to a further preferred embodiment of the proposed method, after the local application of a patch, a pattern is induced on or in the applied coating material while it is not yet solidified. In principle, in view of the composite nature of the patches produced, crack formation is essentially prevented. Nevertheless, due to large strains, cracks may have the tendency to form, the corresponding indentations or grooves of the pattern in the surface of the layer in these regions, if at all, during solidification but also during subsequent use of the coating lead to a controlled minimum crack formation so the generation of large cracks can essentially be prevented. The induction of the pattern can be done mechanically by way of scratching, imprinting, screening, cutting, and can be done thermally and/or chemically. Possible patterns are rectangular or triangular or more generally polygonal normally regular grid patterns, preferably the pattern is a honeycomb type pattern.

While for many applications the application of one single patch will be sufficient, preferably for a particularly robust and thick patch structure, as mentioned above, more than one consecutive and adjacent individual patch layers can be applied. In this case, it is preferred to avoid overlap of the patterns by applying different patterns, and/or identical patterns, which are shifted with respect to each other. In this manner, upon crack initiation, no cracks can penetrate through the whole coating patch. Furthermore, during the application of subsequent layers, cracks, which have formed in an underlying layer, will be filled by material of the subsequent layer.

Furthermore, another aspect of the present invention relates to a gas turbine component comprising a initial application or a repair by using a method according to any of the preceding embodiments.

Furthermore, yet another aspect of the present invention relates to the use of a method as described above for, in particular locally and initially, coating a gas turbine component and/or in particular for repairing gas turbine components with a defective thermal barrier coating area.

BRIEF DESCRIPTION OF THE DRAWINGS

In the accompanying drawings preferred embodiments of the invention are shown in which.

DETAILED DESCRIPTION OF EXEMPLARY EMBODIMENTS

Figure 1:
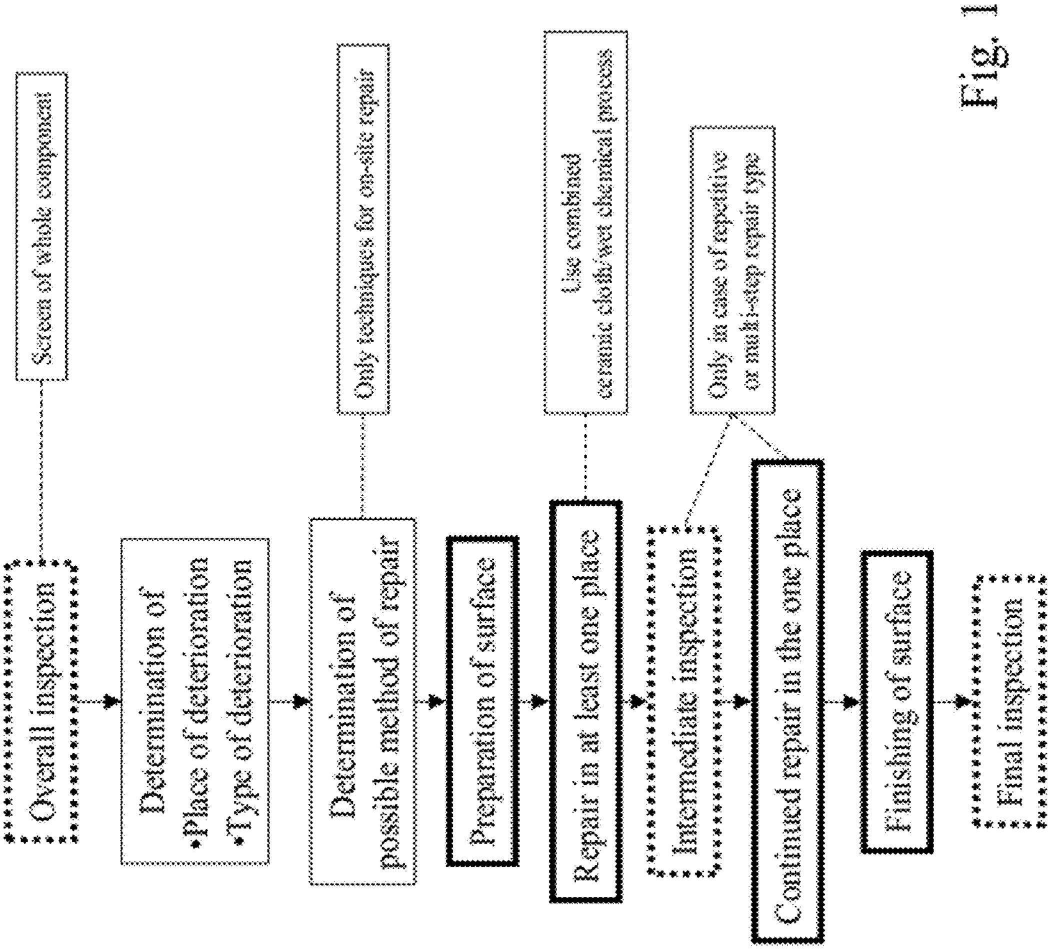
FIG. 1 is a flow diagram of steps of the coating application process according to an exemplary embodiment of the present invention (repair and initial application)

Referring to the drawings, which are for the purpose of illustrating the present preferred embodiments of the invention and not for the purpose of limiting the same, FIG. 1 shows a flow diagram of the steps of an exemplary method according to the present invention. The sequence of steps carried out sequentially is given on the left side and wherever necessary explanations on individual steps are given in boxes on the right side.

The first step is a preliminary, preferably overall inspection of the component, with the aim of identification of the zone or multitude of zones to be repaired. One idea behind this step is to have a comprehensive inspection, allowing to subsequently offer appropriate techniques for different damage types and coating systems. The methods which can be used for this inspection step include, for example, infrared (IR) thermography, ultrasonic testing, Eddy current testing, X-ray fluorescence, and the like to check the integrity and the bonding of the TBC layer and to define the zones to be repaired.

Another possible method is scanning with Eddy Current technology for the determination of the remaining TBC thickness and to detect zones of enhanced erosion.

The same or further methods can be used for testing the bond coat condition with regard to defects or its chemical composition, possible presence of depletion zone, bond coat thickness.

According to the actual need, one or several of the above methods can be used, and apart from the above mentioned non-destructive methods, such as infrared thermography, Ultrasonic testing, Eddy current testing, X-ray fluorescence, also locally destructive methods (local milling, drilling, grinding, etc., normally useful methods include those which only cause a local destruction which can be repaired in the subsequent repair process), can be used for the inspection step, possibly in combination with or after having noticed defects using a non-destructive method.

This inspection is done before repair in an overall manner to define not only the location of defects, but also the nature and the extent of the defects and their accurate position. The methods used are those which allow transportable inspection, and all the methods can be used on- or off-site, but preferably on-site.

As mentioned above, while the preferred methods are non-destructive, they may however also be locally destructive, for allowing further in-depth investigation of critical locations. The locally destructive techniques can be applied after having identified the location and the nature of a defect, using a non-destructive technique. Preference is put onto rapid and non-expensive methods.

In preference, in this first step, there is a defined assessment sequence, which is given by an initial thermography measurement for a first general assessment of the integrity and bonding, and the location of TBC defects. If damaged spots are identified, depending on the result of the thermography inspection, further local inspections, using different non-destructive and/or destructive techniques, are initiated.

As given in the box right below the overall inspection, a purpose of the step of overall inspection is the determination of the place of deterioration and the type of deterioration of the coating layer to be repaired. Once the place, extent, and type of deterioration are determined (preferably automatically), the details of the repair are determined. In this step, possibly the method, if several methods are available, is determined, as well as parameters of the repair method such as thickness, surface, etc., of patch to be applied, etc.

In the case of an initial and new local application of the coating, this initial inspection step can be omitted.

Depending on the place, type of deterioration, and the determined possible method of repair, there can be a following step of preparation of the surface. This preparation can include at least one of the following steps:

- Removal of TBC and/or bond coat layer. This can be effected by, for example, etching (for example in accordance with EP 0 713 957) or by using a technique as described in EP 1 591 549, which includes removal of the TBC layer and a partial restoration of the bond coat layer. Furthermore, it is possible to use micro-blasting, preferably with integrated removal of blasted/removed material (inclusion of a suction system). The idea behind this is to have no contamination of other engine parts, if repair is performed on-site and in mounted condition of the components.
- Further preparation of the surface location can be made by a masking step. For example, it is possible to mask the bond coat and removal and subsequent reapplication in accordance with U.S. Patent Application Publication No. 2007/0063351. Another option is to use a method according to EP 1 591 549, which includes removal of the TBC layer and partial restoration of the bond coat layer. Preferably, this preparation is carried out on round or rounded shapes, in order to avoid edges and corners of the repair patch. The preparation area is always bigger than the determined damage area.
- A further possible preparation step is surface roughening (see for example EP 0 808 913 or EP 1 304 446) by using sandblasting or the like.

This can be assisted or supplemented by etching of the surface, in order to obtain a micro-roughness. The etching product can be a gel, in order to be able to apply it on-site, or the etching product can be fixed with a plaster.

A further possibility is a chemical preparation/activation/removal of the surface, or a combination of physical and chemical methods.

The step of preparation of the surface can optionally be followed by an intermediate inspection step, using at least one of the methods described in the context of the overall inspection, in order to make sure that the step of preparation of the surface is verified, and if necessary, repeated or supplemented by a second preparation step. Such an intermediate inspection step may include the steps of checking of the mechanical integrity of the remaining coating, adjacent to the zone to be repaired, and checking if corrosion or oxidation products are completely removed from zones to be repaired. Depending on the method and the kind of defect, optionally there can be a step of checking of optimum surface preparation for recoating (roughness, cleanliness), if not already done during the surface preparation step.

It is important to note that in accordance with the invention, there is no complete removal of the entire ceramic coating, but only damaged parts are locally removed in case of a preparation of the surface. Consequently, the intermediate inspection step includes the check of the remaining TBC coating for mechanical integrity (the remaining TBC could also be damaged during surface preparation).

Depending on the type and kind of defect, either only part of the TBC layer is removed, the complete TBC layer is locally removed, or, in addition to complete TBC removal, the bond coat layer is removed.

As concerns the TBC refurbishing, it is noted that the thickness of the layer to be obtained must be at least equal to that of the TBC which was present on the intact component, or to be more accurate the final surface after the repair must not differ too much from the desired surface or at least not have sharp transition edges. Correspondingly, there should be smooth transitions between the surfaces of the repaired patch region and the surrounding intact barrier coating.

Therefore, the aforementioned combination with a ceramic tissue is preferred. An idea behind this is to use the properties of wet chemical processes or slurry methods, such as the sol-gel process, to bind at low temperature. Their drawback (too low layer thickness) is overcome by applying a tissue (including cloth and felt structures), so that the sol-gel acts as a glue, or filler for the tissue, and the tissue as such helps to increase the overall thickness. This combination furthermore has the advantage to have a low shrinkage. Furthermore, the obtained microstructure can be controlled. The combination allows an on-site repair, due to the controllable flow properties of the used materials.

As concerns possible methods, specific reference is made to U.S. Pat. Nos. 6,235,352, 5,585,136, and 5,759,932. Sol-gel deposition of TBC-layers of YSZ can include the addition of oxide filler particles to the sol-gel, or the addition of hollow spheres as fillers.

The consistency/texture of the repair patch must be suited to complex geometry and mounted parts. The texture of the slurry must thus be suited to coat complex geometry of parts, preferably mounted, i.e., also inclusive of tilted or even vertical parts. In this respect, it is possible to apply a slurry having thixotropic behavior. Furthermore, the shrinkage of the applied patch must be controlled. Typically shrinkage occurs during drying/heat treatment of the slurry. To avoid this, it is possible to add solid filler particles to the sol-gel, or to add hollow spheres as filler. Also possible is the addition of photopolymerizable binders to the slurry, and to use ultraviolet light for curing the polymers. Additionally possible is the combined use of nano- and macro-particles. Enhanced control of the shrinkage of the layer structure on the one hand can be provided by including such filler material, but can also be provided by using the above-mentioned ceramic tissue. Both filler particles as well as ceramic tissue, even more so if used in combination, can mitigate the problem of shrinkage or at least avoid crack formation during or after solidification.

The microstructure of the obtained layer is preferably controlled in order to obtain a suitable strain tolerance and thermoconductivity. It is therefore possible to use pore formers within the ceramic slurry, in order to obtain a correspondingly adapted porous patch structure. It is also possible to use a fibrous insulating material, which can be infiltrated with the slurry, in order to obtain a better erosion resistance.

As concerns the above-mentioned ceramic tissue, specific reference is made to U.S. Pat. No. 7,153,464, U.S. Patent Application Publication No. 2006/0216547, or EP 1 559 499.

The process is carried out by applying a material, which is a paste or like a paint, or which is a reactive liquid, such as a sol-gel or a slurry acting as cement and/or infiltration material. This material can include the same composition as material used for TBC application usually in a blend or mixture with other components. It may also be of a different composition. So, a first step of one embodiment includes the application of ceramic slurry material on an appropriately prepared surface.

Subsequently, it is possible to apply a tissue, i.e., fibres in the form of a net (woven or non-woven), or as a dense foil. The corresponding ceramic tissue material can have the same composition as the standard TBC, or a different composition. As an alternative, it is possible to apply a soaked tissue or a coated tissue in a one step procedure. So a second step of one embodiment includes the application of ceramic tissue on top, wherein the tissue may be infiltrated, partly infiltrated or not infiltrated with ceramic slurry, wherein infiltration can be done before during or after application.

Optionally, this step or this sequence of steps is followed by drying and/or curing, in order to allow a correct binder hardening (material hardening/solvent elimination, and the like). This step can optionally be followed by a further application of the paste or paint, in order to finish the system (either by impregnation or adding a pre-prepared last composite layer) for better protection under specific conditions. So in case of creating only one patch (or if it is the last patch) the following steps can be performed: application of a finishing layer of ceramic slurry on top; optional patterning; and at least a drying step (optionally curing).

The above-mentioned steps can be repeated until the desired layer thickness is reached. In the case of creating more than one patch on top of each other, the following steps can be applied: performing at least one drying step; apply ceramic slurry material; optional patterning; and apply ceramic tissue layer (and then continue as given in previous paragraph).

As a final step, there can be a heat treatment, which can either be an independent/additional step, or which can be replaced by a controlled first firing of the engine. So finally the whole patch is at least dried and optional cured. It is also possible to cure the patch during engine start up.

After the application of each of these layers it is possible to induce a pattern on or in the applied coating material. The induction of the pattern can take place mechanically (for example, scratching, imprinting, screening, cutting,), thermally, or chemically. A preferred type of pattern is a honeycomb type patterning. The provision of such a pattern localizes crack formation, if at all, taking place during the process of solidification or subsequently, at the positions or regions where the grooves of the pattern are located. Correspondingly the provision of a pattern allows controlling the cracking behavior. If spallation occurs then the areas are very small and distinguished. According to a preferred method, if several individual layers are applied, preferably different patterns, or patterns which are intentionally laterally shifted, are applied to adjacent covering layers. The application of a pattern to each of consecutive layers leads to the fact that cracks formed in a lower layer are at least partially healed during the application of the subsequent layer, thereby avoiding cracks which penetrate through the whole coating thickness. The texturing of the surface of individual layers in such a manner increases the lifetime and the stress tolerance of the corresponding repair patch (and equally if it is not the repair patch but an initially applied patch).

In the case of unequal height of repaired and remaining TBC coating and to set up a smooth transition, an adjustment of the coating to the surrounding area can be carried out at the end.

The main aspects of this repair step, which is carried out in at least one place, but preferably either in parallel or sequentially in all the places which have been spotted in the overall inspection step, includes the following elements:

- use of tissue in combination with slurry or sol gel, to maintain the build-up;
- the tissue and/or matrix can be based on the material used for TBC application, but can also be of a different material, adapted to the application;
- use of surface patterning to localize crack formation, if cracking occurs at all; and
- cracks can be healed by applying the next layer.

Other purposes of this repair step are as follows:

- obtaining a similar thickness as of the intact TBC;
- have good adhesion;
- prevent full spallation at the same position again;
- control of shrinkage and porosity;
- homogeneous thickness build-up;
- easy applicability;
- surface patterning (structuring) allowing for a localized crack network, which, if occurring at all, can help improve the strain tolerance of the coating application; and
- tissue avoids the flowing down of the slurry, when applied in particular on vertical surfaces.

After finishing the repair, which, as indicated in the flow diagram can be followed by a finishing of the surface by machining, chemical treatment, the method includes a final inspection step. The final inspection mainly covers the check of the integrity of the repaired area, i.e., checking of TBC internal cracking, due to shrinking, bonding to the underlying metallic bond coating, and bonding to the adjacent/remaining TBC. The same methods as for the initial overall inspection technique can be used. If, during this final inspection, it is noted that the repair was insufficient or needs to be supplemented, the above-discussed sequence of steps can be repeated, as often as necessary and appropriate.

As mentioned above, the flow diagram as illustrated in FIG. 1 equivalently applies to the situation of a first initial application of a patch layer using a method according to the present invention. As also mentioned above in this case, however, there will be in most cases no step of overall inspection, as in these cases it is usually clear where the patches need to be applied, there is no determination of the place of deterioration and the type of deterioration and no determination of possible method of repair. Whether the step of preparation of the surface will be necessary under the circumstances depends on the component surface at the place where the patch(es) is/are to be applied. If the component already has a correspondingly suitable surface at this location, the preparation of the surface is not necessary. In case of an initial application, the step of "repair in at least one place" is just the step of "application in at least one place", and the step of "continued repair in the one place" is just a step of "continued application in the one place".

FIGS. 2 to 8 show schematic cross-sectional views in a plane vertical to the surface plane of a component, in order to illustrate the different repair possibilities. On a base metal 1, such a protective layer structure usually includes a bond coat layer 2, and on top of this bond coat layer 2, there is provided a top coat layer 3, which is the actual thermal barrier coating layer, typically a YSZ-layer.

Figure 2:
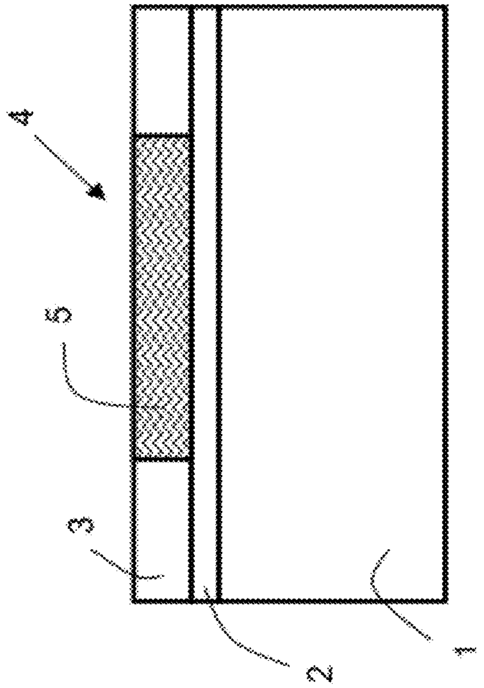
FIG. 2 is a schematic cross-sectional view through a repair region according to a first embodiment.

FIG. 2 shows a repaired region 4, in which a single ceramic composite layer patch 5 has been inserted into an area in which the complete top coat layer 3 has either spalled off or been removed in the preparation step. The patch layer 5 results from a combination of the use of a wet thermal barrier coating layer deposition process (i.e., sol-gel process) with a ceramic tissue, as described above (the wavy lines schematically indicating the tissue embedded in ceramic material).

Figure 3:
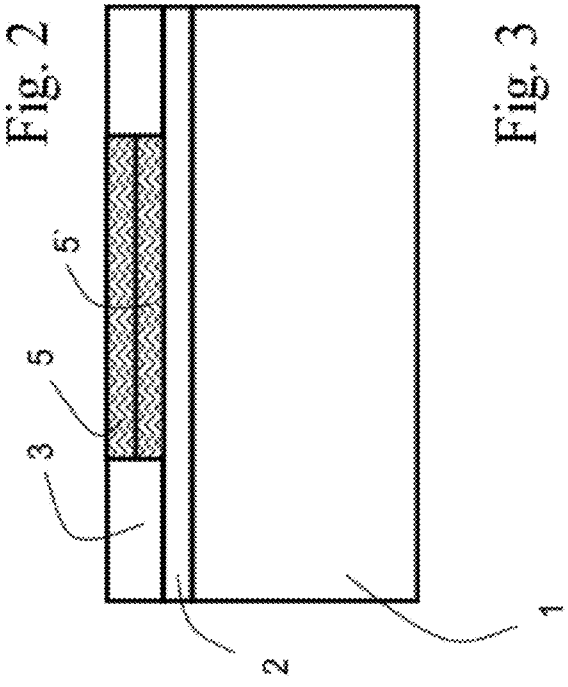
FIG. 3 is a schematic cross-sectional view through a repair region according to a second embodiment with several repair layers of the same type.

FIG. 3 illustrates that such a repair patch can be built up of several layers. In the specific example as illustrated in FIG. 3, there are two layers, an initial layer 5', and a top layer 5. The layers are applied sequentially, i.e., first, the lower layer is applied, if necessary followed by an intermediate inspection, and then the top layer 5 is applied, if necessary followed by finishing of the surface.

Figure 4:
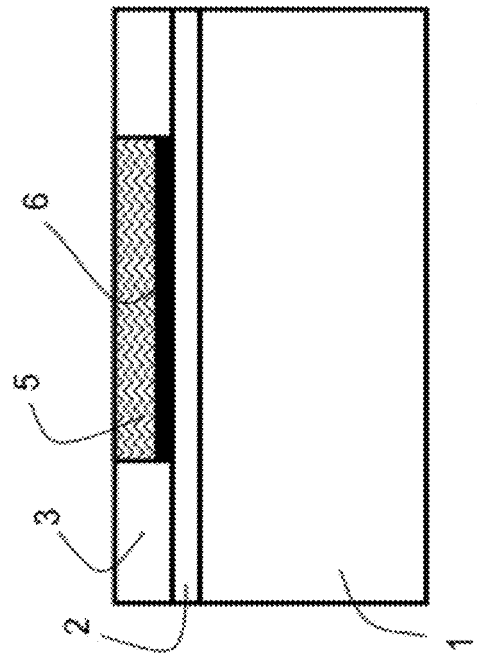
FIG. 4 is a schematic cross-sectional view through a repair region according to a third embodiment with several repair layers of different type of materials and different thickness.

As illustrated in FIG. 4, the repair patch does not necessarily have to be formed of the same material and be applied by using the same method. In this example, there is provided a lower repair patch layer 6, which can for example be a layer of material applied using solely wet deposition, and a top layer 5, subsequently applied, if necessary preceded by an intermediate inspection, is a patch produced by a combined wet process with a ceramic tissue.

Figure 5:
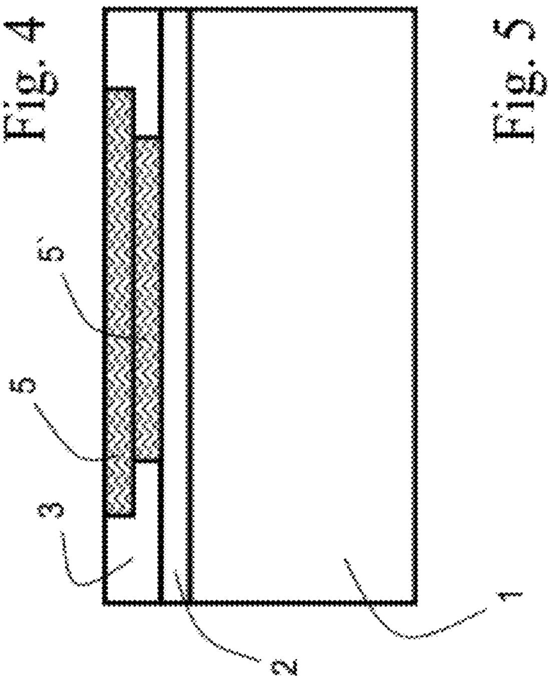
FIG. 5 is a schematic cross-sectional view through a repair region according to a fourth embodiment with several repair layers of different lateral extension.

As illustrated in FIG. 5, the patch does not necessarily have to be of the same size over different layers, so very often damages have some kind of a conical structure, being more pronounced in the surface region than in the lower regions, which then, in case of a repair zone, may result in a structure as illustrated in FIG. 5.

Figure 6:
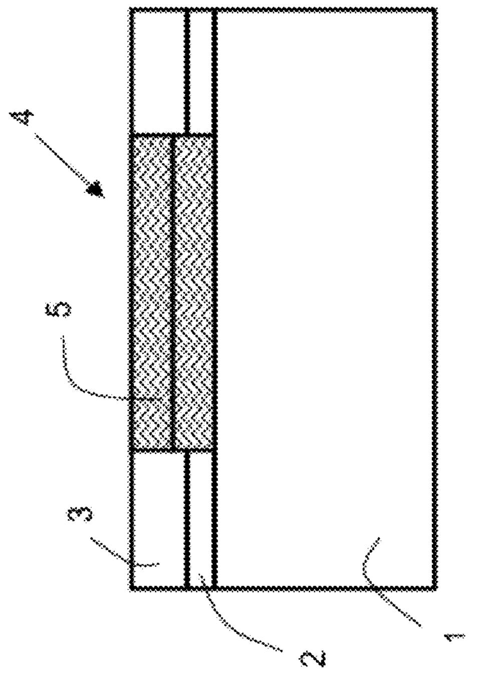
FIG. 6 is a schematic cross-sectional view through a repair region according to a fifth embodiment where also the bond coat has been removed.

As illustrated in FIG. 6, if also the bond coat is removed (or spalled off) prior to application of the repair patch 5, the repair patch does not normally include a new bond coat layer patch but only one or several layers with ceramic material.

Figure 7:
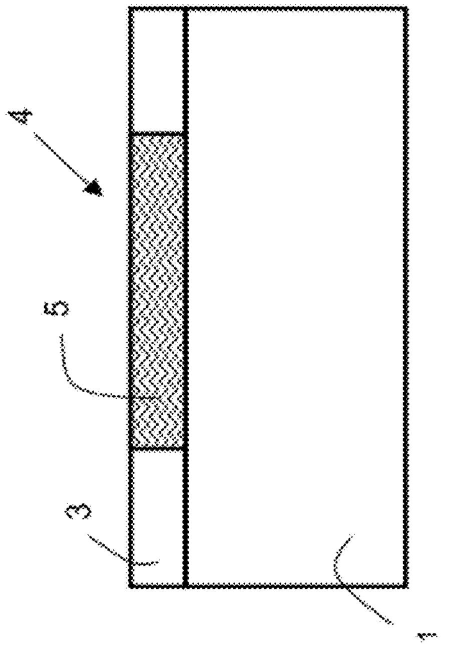
FIG. 7 is a schematic cross-sectional view through a repair region according to a sixth embodiment where there is no bond coat layer.

As illustrated in FIG. 7, the repair method may also be applied in a situation where the thermal barrier coating is attached to the base material 1 without a bond coat layer. It should be noted that in FIGS. 2 to 7, only repairs of the full TBC layer are indicated. It should however be noted that the patch may also include only a part of the TBC layer so for example only the upper third of the full thickness of the TBC layer.

Figure 8:
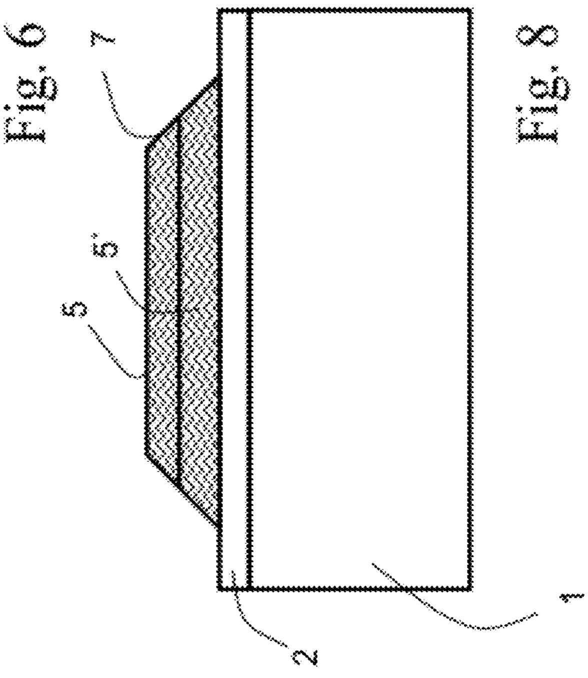
FIG. 8 is a schematic cross-sectional view through a local application region according to a seventh embodiment.

FIG. 8 illustrates a situation where not a repair patch in a gap in an existing TBC layer is applied, but where the method is used for the initial application of a local patch of coating. In these situations is important to make sure that there are smooth transitions between the applied patch of ceramic coating and the surrounding surface. This in FIG. 8 is schematically illustrated by an inclined edge portion 7 of the patch which can either be provided before, during, or after the application of the patches 5 and 5'. It is also possible to apply such a patch, also for example in the form of a stripe within a recess which in the preceding step has been milled out of the base material. The patch in this case includes two ceramic layers 5 and 5', both including a ceramic tissue embedded in a ceramic matrix material.

Figure 9:
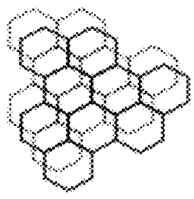
FIG. 9 is a schematic top plan view onto the honeycomb patterning of two consecutive layers.

FIG. 9 illustrates the possibility of the application of a pattern in a staggered manner. In this figure, a honeycomb type pattern is applied to consecutive layers 5, 5'. The pattern is thereby shifted from one layer to the next one, which is indicated by the dotted pattern applied to the lower layer 5', and the solid line pattern applied to the upper layer 5. As crack formation takes place, if at all, along these lines, cracks present in the lower layer 5' will not only be healed during the application of the upper layer material by penetration of upper layer material into the cracks of the lower layer, but due to the staggered arrangement of the patterns it is furthermore avoided that cracks penetrate through the final thickness of the total layer.

Advantages of the invention can be summarized as follows:

Comprehensive inspection approach

Inspection prior to repair in order to locate all defect types (assessment of TBC and of BC);

Lifetime assessment of the remaining coating;

Use of appropriate techniques with stepwise approach (first roughly screen whole component, in case of findings, do a more detailed observation of the defects with the appropriate technique);

Only techniques are in scope which are usable on-site, in a mounted condition, and are easy to use and transportable;

Inspection during intermediate steps of the repair (in case of repeated steps) to early observe potential defects of the repair;

Final inspection after repair to guarantee durability of the coating;

Instead of using a pure TBC slurry, a combination of a ceramic tissue and a wet chemical process (ceramic based slurry) is used, possibly in combination with surface patterning, resulting in a ceramic matrix composite;

Composite approach helps to control the viscosity, repair/initial application of a component in vertical position possible;

Composite material helps to reduce the shrinkage (in general lower shrinkage than for a pure slurry approach);

Use of ceramic tissue improves strain tolerance of the repaired location compared to a coating without ceramic fiber material as, for instance, described in U.S. Patent Application Publication No. 2007/0224359 A1;

With the composite approach, critical regions like concave/convex shapes can be reliably repaired;

Controlled build up of the repaired coating in different layers/steps, thickness can be adjusted to actual need;

Ceramic tissue can be infiltrated in a controlled manner, final microstructure (e.g., porosity and thermal properties) is controllable;

Method can be used to build up TBC on top of metallic BC (e.g., repair of black failures) or to build up TBC on top of TBC (e.g., repair of white failures);

Method not only for repair but also for initial application, i.e., to protect certain local areas on structural parts with a ceramic layer; and Materials used for the repair do not necessarily have to have the same composition as the surrounding ceramic coating. To avoid negative effects at the interface original TBC/repair such as sintering or phase changes the surrounding TBC can be locally sealed. Further a chemical barrier to the surrounding material can be provided.

The following specific examples shall serve as an illustration that the proposed method using a combination of a ceramic tissue and a slurry either for the repair or for the initial application of a coating is feasible and can lead to a well attached, essentially crack-free reliable and robust coating:

Example 1

A coating patch as described above was fabricated on top of a sample made from a Ni-based alloy. Surface preparation in this specific situation was not performed since it was not necessarily, as the alloy was already coated with an oxidation resistant overlay coating providing a rough surface. After cleaning, as a first step a thin layer of ceramic slurry was applied to the surface. Subsequently and after application, a flexible ceramic tissue (Woven Knit Cloth, supplied by Zircar Zirconia, Inc.) of an adapted size was attached on top of the still-liquid slurry leading to an infiltration of at least the lower part of the tissue. After drying and curing using a hot air fan, an intermediate inspection step was carried out to check the adhesion of the composite layer to the substrate. In the second coating cycle a thin layer of ceramic slurry was applied onto the ceramic tissue again leading to an infiltration of at least the upper part and therefore a stabilization of the ceramic tissue. On top of the slurry layer another ceramic tissue was applied and the overall stack was then dried and cured and subsequently inspected for coating defects. In the last step of the coating procedure, a finalizing ceramic slurry layer was applied to the surface and the overall patch again dried and cured. For the tested case the required thickness was reached by application of two individual repair patches and a final layer of ceramic slurry on top.

Alternatively, the overall thickness can be adapted by applying further patches or by reducing their number.

At the end of the procedure a final non-destructive inspection of the overall coating patch was done, concentrating on good adhesion of the repair without delaminations.

Figure 10:
FIG. 10 is a photograph of example 1

FIG. 10 shows a microscopic cross-sectional picture of the coating structure according to example 1. The picture was taken by optical microscopy showing two individual repair patches formed of ceramic slurry and infiltrated ceramic tissue and a final layer of ceramic slurry.

Example 2

The same method as described above under example 1 was used for making a patch of a barrier coating. In this second example, after application of each layer, the layer was structured using a honeycomb surface imprinting with an approximately 3 mm honeycomb cell size. For the structuring of the surface, a honeycomb pattern was imprinted into the surface by rolling a specifically structured tool over the ceramic slurry layer such that a pattern of grooves was generated with a penetration depth of the generated grooves of approximately 50 μm. The generated pattern was shifted for each subsequent layer, so the generated grooves of the subsequent layers were staggered with respect to each other (see also FIG. 9).

The resulting coating structure in the patch region was free of cracks and attached well to the underlying structure.

LIST OF REFERENCE NUMERALS

1 base metal of component
2 bond coat layer
3 top coat layer, thermal barrier coating layer
4 repaired region 5 single ceramic tissue layer patch resulting from combined wet process 6 repair patch not based on ceramic tissue (made of ceramic slurry)

7 edge portion (tapered edge regions of coated area)

While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

We claim:

1. A method for the local initial application of a thermal barrier coating layer, or the local repair of coating defects and/or deteriorations, of components in the hot gas path of a gas turbine engine, which components are at least locally coated or to be coated with a thermal barrier coating layer, the method comprising:

(III) locally applying a ceramic tissue and a wet chemical thermal barrier coating layer deposition material to a location of said component, forming a patch of ceramic matrix composite;

(IV)a optionally inspecting said patch, the surface of the component, or both;

(IV)b optionally locally applying at least one additional ceramic tissue and a wet chemical thermal barrier coating layer deposition material, forming at least one additional patch of ceramic matrix composite, at said location;

(V) optionally surface finishing at said location; and (VI) optionally inspecting said location;

wherein, in addition to step (III), at least one of steps (IV)a or (VI) is performed;

wherein said locally applying a ceramic tissue and a wet chemical thermal barrier coating layer deposition material comprises infiltrating the ceramic tissue with the wet chemical thermal barrier coating layer deposition material prior to, during, after, or combinations thereof, said applying the ceramic tissue to said location; and wherein said infiltrating the ceramic tissue with the wet chemical thermal barrier coating layer deposition material comprises first, applying the wet chemical thermal barrier coating layer deposition material to said location, second, applying ceramic tissue to said location to form a composite, third, drying the composite, and fourth, applying a finishing layer of the wet chemical thermal barrier coating layer deposition material.

2. A method according to claim 1, wherein the wet chemical thermal barrier coating layer deposition material comprises sol-gel processed material or a ceramic based slurry material.

3. A method according to claim 1, wherein, in said second step of applying ceramic tissue, said ceramic tissue is partly infiltrated with wet chemical thermal barrier coating layer deposition material.

4. A method according to claim 1, wherein the ceramic tissue comprises a structure made of ceramic, glass, or glass-ceramic.

5. A method according to claim 4, wherein the ceramic tissue comprises a ceramic cloth or a ceramic felt.

6. A method according to claim 1, wherein said (III) locally applying is preceded by at least one of:

(I) overall inspecting the whole component and determining at least one location of a defect, a deterioration, or both, and determining corresponding types of defect, deterioration, or both, at each of said at least one location; and (II) preparing the surface at said at least one location.

7. A method according to claim 6, wherein said (II) preparing comprises infiltrating, sealing, or both, a ceramic area surrounding said at least one location with a chemical barrier.

8. A method according to claim 6, wherein said (I) overall inspecting the whole component further comprises determining defects, deteriorations, or both, in the thermal barrier coating layer, in an underlying bond coat layer, or in both.

9. A method according to claim 8, wherein determining defects, deteriorations, or both, comprises determining with a non-destructive method selected from the group consisting of infrared thermography, ultrasonic testing, Eddy current testing, and X-ray fluorescence.

10. A method according to claim 8, wherein determining defects, deteriorations, or both, comprises determining with a locally destructive but repairable process.

11. A method according to claim 10, wherein said locally destructive but repairable process comprises local removal of thermal barrier coating layer, of bond coat layer, or of both.

12. A method according to claim 6, wherein said (II) preparing the surface comprises:

removing deteriorated thermal barrier coating layer material, bond coating layer material, or both;

preparing a surface;

masking of a surrounding area; or combinations thereof.

13. A method according to claim 6, further comprising, after said (II) preparing the surface and before said (III) locally applying:

inspecting said location, including determining the mechanical integrity of remaining coating adjacent to said location, identifying the presence of corrosion and/or oxidation products on said location, or both.

14. A method according to claim 13, wherein inspecting said location comprises evaluating the coating roughness and cleanliness.

15. A method according to claim 1, wherein said (IV)a inspecting said patch further comprises determining defects, deteriorations, or both, in the thermal barrier coating layer, in an underlying bond coat layer, or in both.

16. A method according to claim 15, wherein determining comprises determining with a non-destructive method selected from the group consisting of infrared thermography, ultrasonic testing, Eddy current testing, and X-ray fluorescence.

17. A method according to claim 1, wherein said (III) locally applying, and optionally said (IV)b locally applying, comprises:

applying a wet chemical thermal barrier coating layer material as a paste or as a paint or as a reactive liquid; and thereafter applying a ceramic tissue.

18. A method according to claim 17, further comprising, after said applying a ceramic tissue:

curing;

heat treating;

applying a wet chemical thermal barrier coating deposition material; or combinations thereof.

19. A method according to claim 1, wherein said (IV)b locally applying, said (V) surface finishing, or both, further comprises sealing the location with a protective layer.

20. A method according to claim 1, wherein said (III) locally applying and said (IV)b locally applying comprise applying at least two patches, which at least two patches have the same or different lateral size, the same or different thicknesses, are of the same or different deposition type, and are of the same or different material.

21. A method according to claim 1, wherein said (III) locally applying, said (IV)b locally applying, or both, comprises applying said patch on a bond coat layer, on a thermal barrier coating layer, directly on a base material, or on combinations thereof.

22. A method according to claim 1, further comprising, during or after any of said locally applying a patch:

inducing a pattern on or in the applied coating material while not fully solidified.

23. A method according to claim 22, wherein inducing a pattern comprises:

mechanically inducing by scratching, imprinting, screening, or cutting;

thermally inducing;

chemically inducing; or combinations thereof.

24. A method according to claim 22, wherein inducing a pattern comprises inducing a honeycomb pattern.

25. A method according to claim 22, wherein said locally applying a patch comprises applying at least two consecutive and adjacent individual layers, and wherein inducing a pattern comprises inducing patterns to adjacent covering patches.

26. A method according to claim 25, wherein said patterns comprise different patterns in adjacent covering patches.

27. A method according to claim 25, wherein said patterns comprise laterally shifted identical patterns in adjacent covering layers.

* * * * *